(12) United States Patent
Anderlini

(10) Patent No.: US 7,435,143 B2
(45) Date of Patent: Oct. 14, 2008

(54) FIXTURE FOR OPTOELECTRONIC COMPONENTS SUCH AS PLCC2-TYPE AND PLCC4-TYPE LIGHT EMITTING DIODES

(75) Inventor: Daniel Anderlini, Valdahon (FR)

(73) Assignee: CML Innovative Technologies, Besançon Cédex (FR)

( * ) Notice: Subject to any disclaimer, the term of this patent is extended or adjusted under 35 U.S.C. 154(b) by 0 days.

(21) Appl. No.: 11/202,791

(22) Filed: Aug. 12, 2005

(65) Prior Publication Data

US 2006/0060881 A1    Mar. 23, 2006

(51) Int. Cl.
*H01R 24/00* (2006.01)

(52) U.S. Cl. .................. 439/699.2; 439/698

(58) Field of Classification Search ............ 439/56, 439/699.2, 617, 698; 362/800; 313/318.1
See application file for complete search history.

(56) References Cited

U.S. PATENT DOCUMENTS

| 5,197,792 | A | | 3/1993 | Jiao et al. |
| 5,261,837 | A | * | 11/1993 | Kilsdonk et al. ............ 439/617 |
| 5,707,130 | A | | 1/1998 | Berlitz et al. |
| 6,061,160 | A | * | 5/2000 | Maruyama .................. 398/201 |
| 6,422,716 | B2 | | 7/2002 | Henrici et al. |
| 6,582,100 | B1 | * | 6/2003 | Hochstein et al. ........... 362/294 |
| 6,583,542 | B2 | * | 6/2003 | Nagano et al. ......... 313/318.01 |
| 7,114,841 | B2 | * | 10/2006 | Aanegola et al. ............ 362/640 |
| 2002/0018350 | A1 | | 2/2002 | Lepley et al. |
| 2003/0058658 | A1 | * | 3/2003 | Lee ............................ 362/555 |
| 2003/0123260 | A1 | | 7/2003 | Aynie et al. |
| 2003/0156417 | A1 | | 8/2003 | Gasquet et al. |
| 2004/0057244 | A1 | | 3/2004 | Amano |
| 2004/0070855 | A1 | | 4/2004 | Benitez et al. |
| 2005/0239342 | A1 | * | 10/2005 | Moriyama et al. ....... 439/699.2 |
| 2007/0034886 | A1 | * | 2/2007 | Wong et al. .................. 257/98 |

FOREIGN PATENT DOCUMENTS

| DE | 10053573 | 5/2002 |
| FR | 2870083 | 11/2005 |
| GB | 2297149 | 7/1996 |
| GB | 2324364 | 10/1998 |
| WO | WO 9909349 | 2/1999 |
| WO | WO 0233449 | 4/2002 |

\* cited by examiner

*Primary Examiner*—Neil Abrams
(74) *Attorney, Agent, or Firm*—Gary M. Cohen

(57) ABSTRACT

A device for holding and for the connection of optoelectronic components, such as light-emitting diodes (LED's) of the PLCC2 and PLCC4 type, is formed from a body made of plastic coupled with a metal cluster. The metal cluster includes a contact arm and a positioning arm having a cooperating spigot for positioning and holding the LED's, and for ensuring electrical contact with the electrodes of the LED's.

5 Claims, 6 Drawing Sheets

FIXTURE FOR OPTOELECTRONIC COMPONENTS SUCH AS PLCC2-TYPE AND PLCC4-TYPE LIGHT EMITTING DIODES

BACKGROUND OF THE INVENTION

The present invention relates to a device for holding and for the connection of optoelectronic components such as light-emitting diodes (LED's) of the PLCC2 and PLCC4 type.

Optoelectronic components, such as light-emitting diodes, are usually fixed onto printed circuits by means of a solder joint. However, since printed circuits designed for holding light-emitting diodes are rigid and flat, it becomes complicated and costly to produce lighting devices having a specific shape, such as a domed shape.

Furthermore, several operations need to be performed when the light-emitting diodes are mounted onto the printed circuits. Such operations include the application of adhesive onto the printed circuit, the installation of the light-emitting diode onto the printed circuit, the application of tin onto the printed circuit, and heating of the printed circuit in a soldering oven to form desired solder joints. A check of the solder joints is then carried out at the end of the mounting process.

These different processing constraints increase the production costs of devices using optoelectronic components, such as light-emitting diodes, because the mounting process is long and sometimes complicated (in the case of non-planar shaped devices).

SUMMARY OF THE INVENTION

Such drawbacks are remedied by providing a device for both the holding and the electrical connection of optoelectronic components, such as light-emitting diodes, while at the same time providing flexibility in terms of circuit shapes and a simplification of the mounting process.

For this purpose, and in accordance with the present invention, a device is provided for holding and for the connection of optoelectronic components, such as light-emitting diodes of the PLCC2 and PLCC4 type, which device is formed from a body coupled with a metal cluster.

Light-emitting diodes, hereafter denoted using the abbreviation "LED's", can be of various different types. PLCC (i.e., "plastic leaded chip carrier") type LED's, such as PLCC2 and PLCC4 LED's, are optoelectronic components designed for surface mounting.

BRIEF DESCRIPTION OF THE DRAWINGS

The invention will be better understood with reference to the appended drawings, in which.

DETAILED DESCRIPTION OF THE INVENTION

Figure 1:
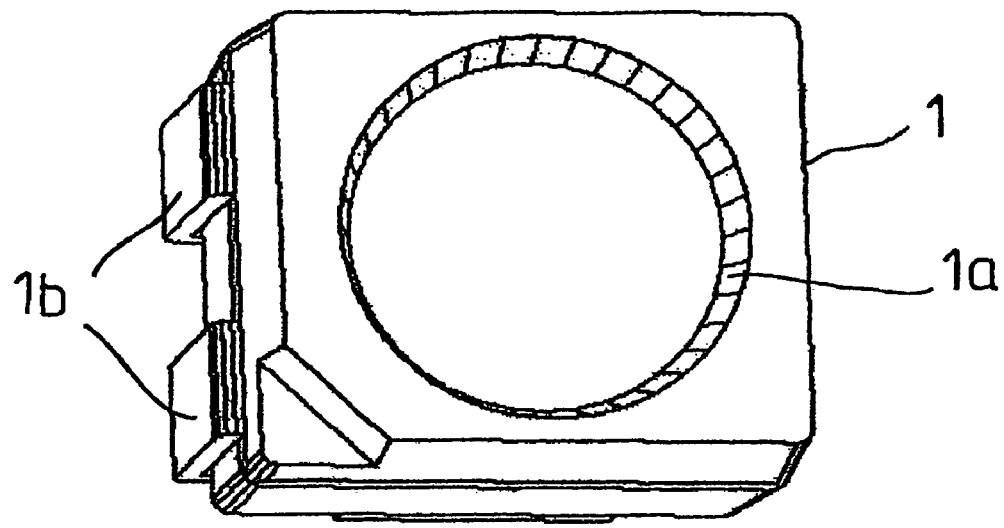
FIG. 1 is a representation of an LED seen from above.
Figure 2:
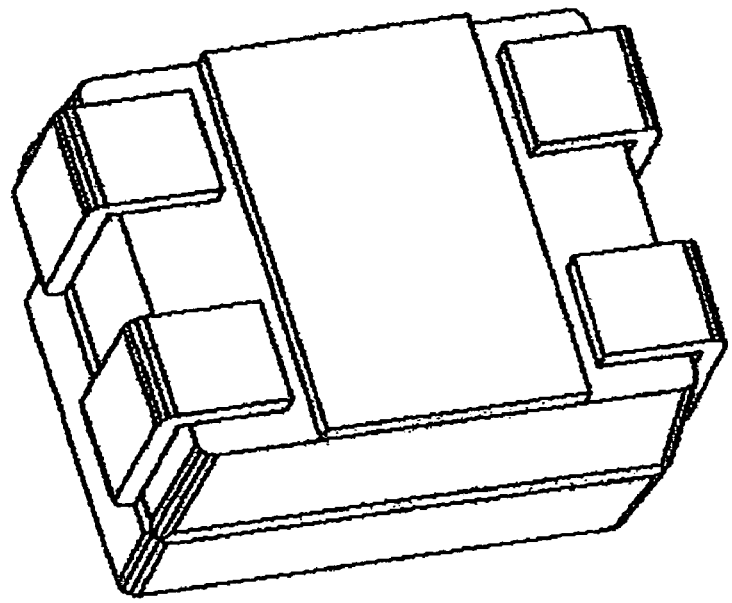
FIG. 2 is a representation of the LED seen from below.
Figure 3:
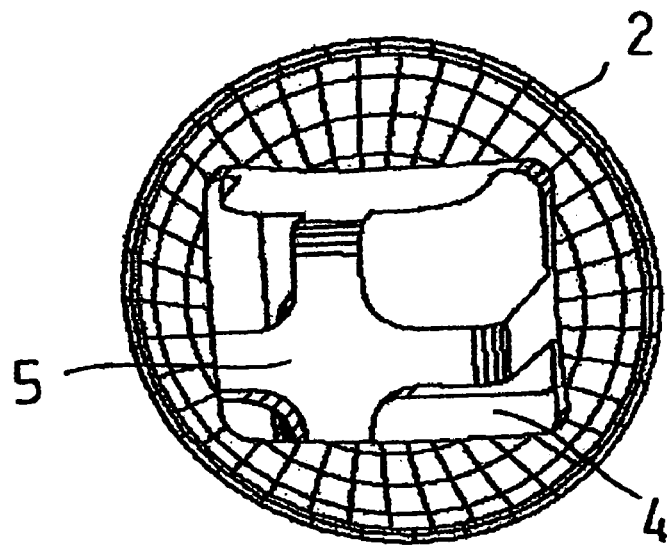
FIG. 3 is a representation of the body before the insertion of an LED.
Figure 4:
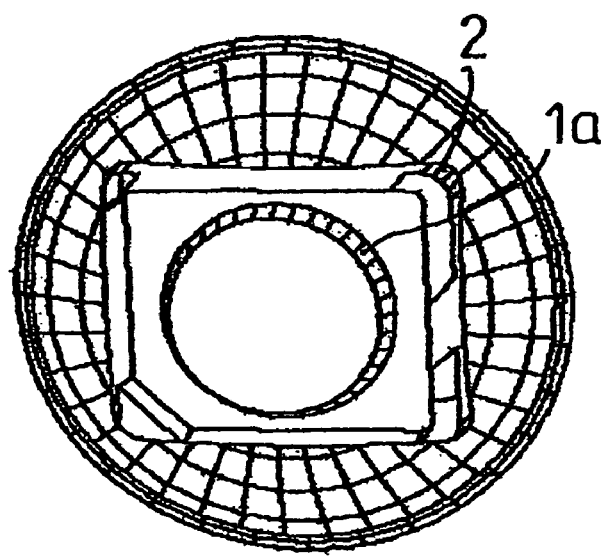
FIG. 4 is a representation of the body after insertion of the LED.
Figure 5:
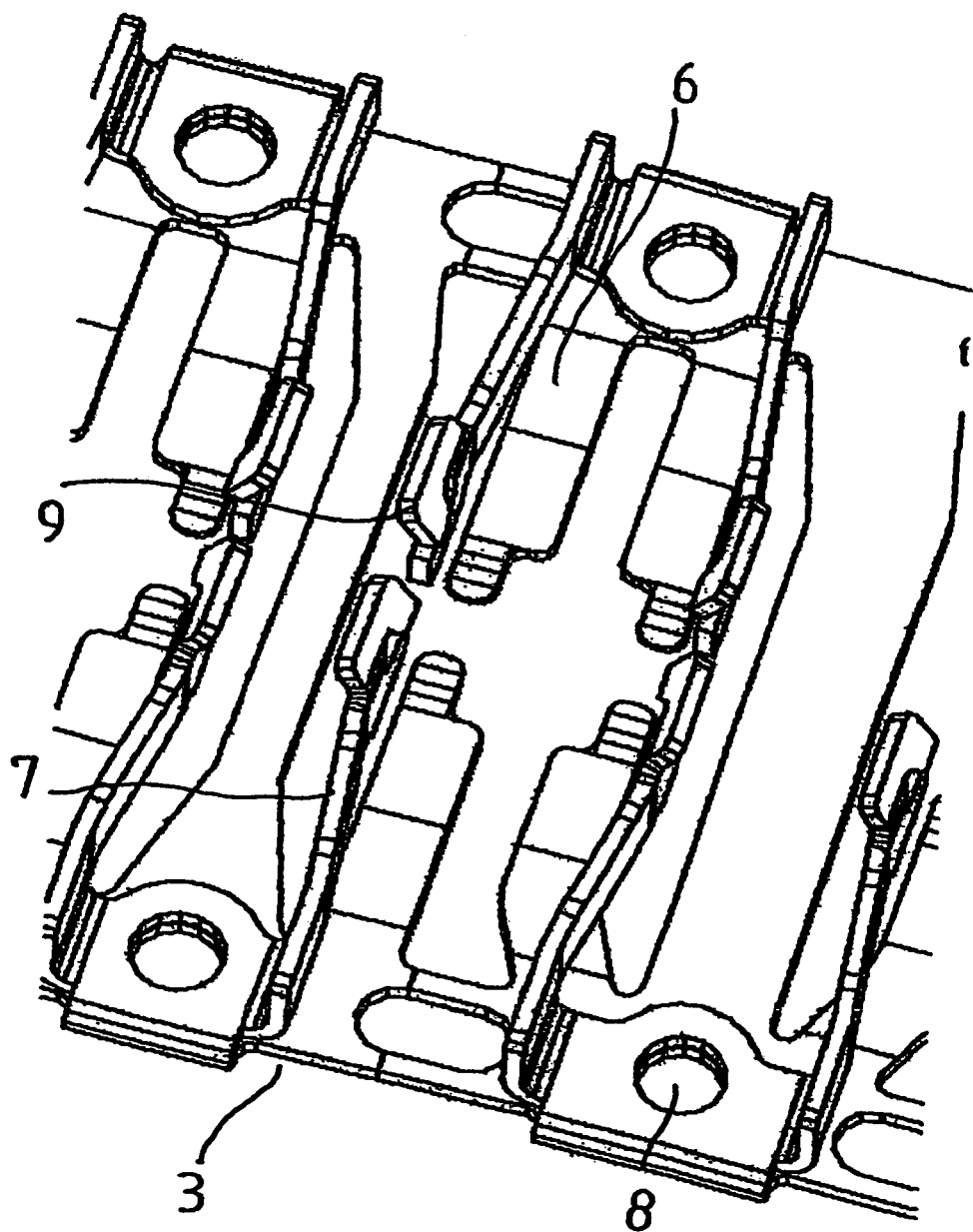
FIG. 5 is a representation of the metal cluster before the insertion of an LED.
Figure 6:
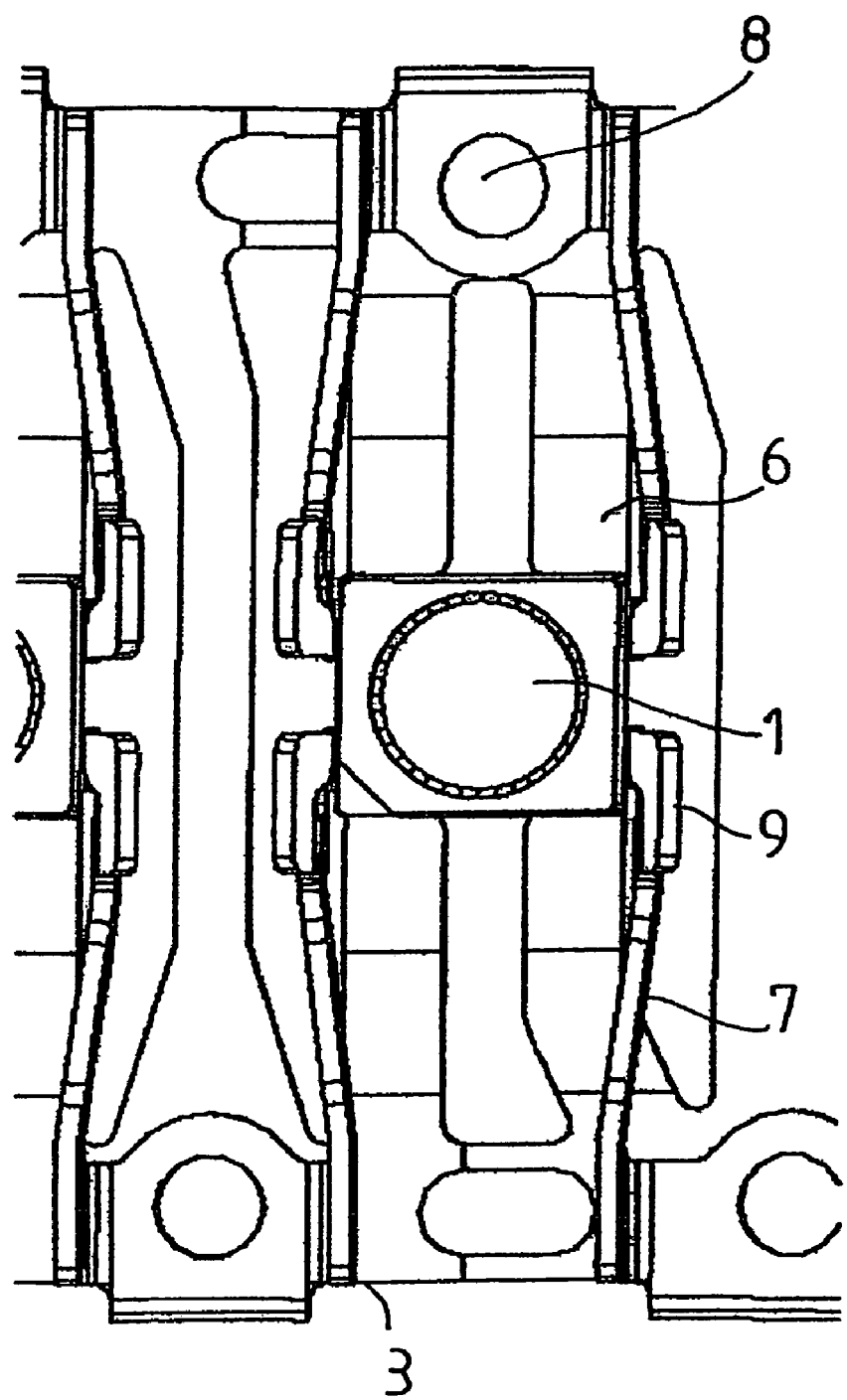
FIG. 6 is a representation of the metal cluster, schematically illustrating attachment of the LED, with the body removed to reveal construction detail.
Figure 7:
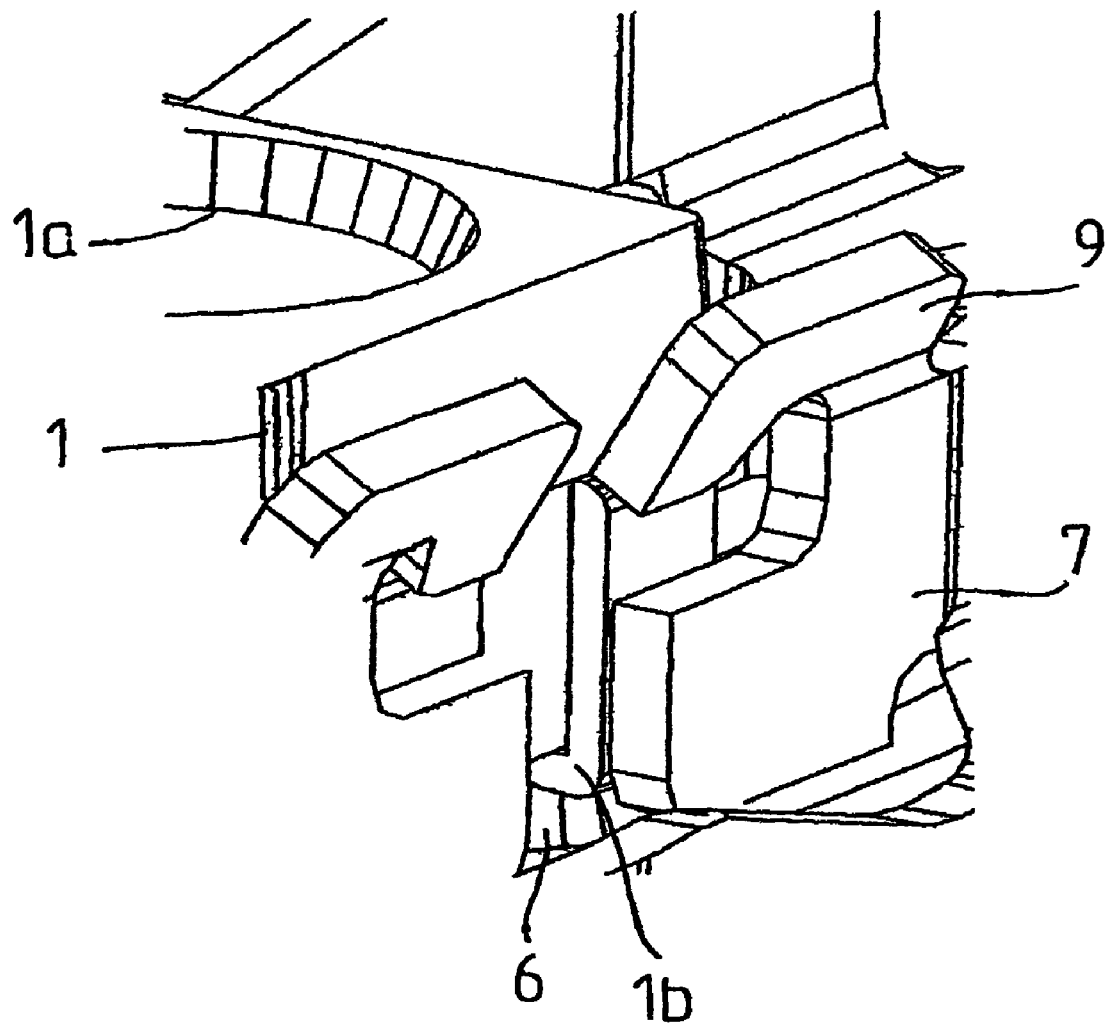
FIG. 7 is an enlarged representation of the metal cluster after attachment of the LED, with the body removed to reveal construction detail.
Figure 8:
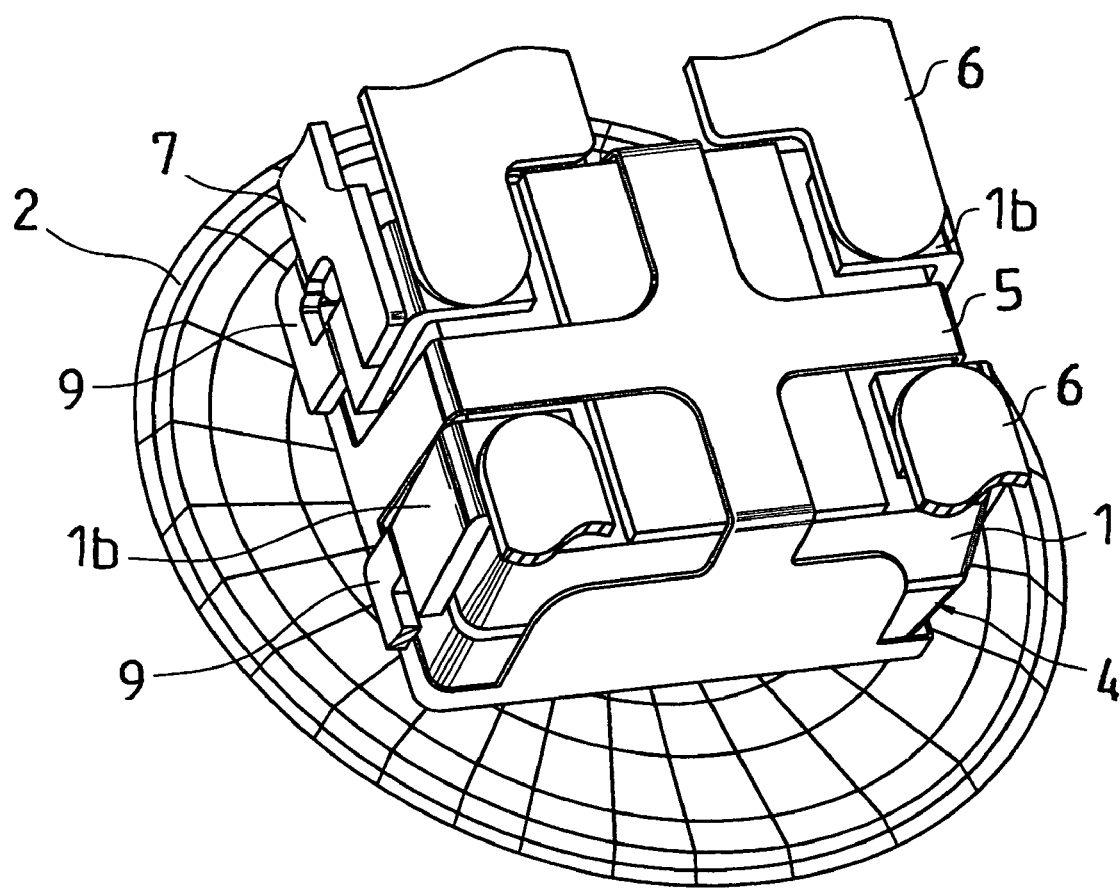
FIG. 8 is a representation of an assembly of the LED, the body and the metal cluster.

The LED's 1 are generally comprised of a light-emitting region 1a and electrodes 1b for providing desired electrical connections.

The device of the present invention is formed principally from a body 2 made of plastic, coupled with a metal cluster 3. An LED 1 can then be suitably inserted into the metal cluster 3.

The metal cluster is comprised of an assembly of contacts forming desired electrical pathways. The assembly can be cut up and bent according to the shapes that are desired. The resulting, single-piece assembly is then connected together and appropriately separated by an operation called de-shunting. During this operation, bridges, or shunts, connecting the various electrical pathways are cut to obtain an operational electrical circuit.

Because the body 2 has a plastic composition, the body 2 can have a planar or domed shape, or any other shape, according to the desired aesthetic appearance of the lighting system. The shape of the body 2 is such that it allows the LED 1 to be inserted and held fixed in position. To this end, the body 2 is provided with openings 4 for receiving the electrodes 1b of the LED's 1 and limit stops 5 which will stop the advancement of an LED 1 when it is inserted into the body 2.

The metal cluster 3 that is fixed onto the body 2 comprises a contact arm 6 and an arm 7 which is designed for positioning and holding the LED's. The cluster is provided with holes 8 which permit the cluster to be attached to the body 2.

The contact arm 6 of the metal cluster 3 establishes electrical contact with the electrodes 1b situated under the LED 1. The contact arm 6 is formed from an elastic material, which allows the contact arm 6 to be spring loaded and which ensures good electrical contact with the electrodes 1b.

One purpose of the positioning arm 7 of the metal cluster 3 is to ensure the correct positioning of the LED 1 in its socket. Another purpose of the positioning arm 7 is to provide electrical contact with the electrodes 1b of the LED's. This contact is made on the side of the electrodes 1b. The positioning arm 7 is further provided with a spigot 9 that locates itself on the upper part of the electrode 1b of the LED 1 to ensure that the electrode 1b is held in its socket, and also to ensure that the electrode 1b is pushed against the contact arm 6.

The device of the present invention ensures electrical contact at a minimum of two points on each electrode of the LED. This is ensured by the contact arm 6 and the spigot 9 situated on the holding arm 7, which cooperate to maintain the desired contact. In addition, each of the arms of the metal cluster plays a thermal role by allowing heat generated by the LED to be dissipated via the electrodes.

In order to form the desired electrical circuit, the metal cluster 3 is provided with bridges or shunts. The bridges or shunts are cut during the assembly of the metal cluster 3 onto the plastic body 2. The metal cluster 3 can be equipped with one or more LED's 1, and can have various shapes that adjust to the shapes of the plastic body, allowing three-dimensional electrical circuits to be produced.

Although the invention has been described using specific means of implementation, the present invention includes all technical equivalents of the means described.

The invention claimed is:

1. A device for holding and for establishing electrical connection with an optoelectronic component, including PLCC2-type and PLCC4-type light-emitting diodes, wherein the device comprises a body and a metal cluster, wherein the body is made of plastic and has a region for receiving the optoelectronic component, and wherein electrodes associated with the optoelectronic component are placed in electrical contact with the metal cluster to form an electrical circuit with the optoelectronic component, wherein the metal cluster includes a contact element made of an elastic material and establishing the electrical contact between the optoelectronic component and the metal cluster, and an arm holding and positioning the optoelectronic component within the body and the metal cluster, and wherein the contact element is in contact with portions of the electrodes situated underneath the optoelectronic component, wherein the arm includes a spigot on an upper part of the arm which pushes against upper portions of the electrodes, and wherein the arm is in contact with side portions of the electrodes.

2. The device of claim 1 wherein the optoelectronic component is a PLCC2-type light-emitting diode.

3. The device of claim 1 wherein the body includes a plurality of openings for placing the electrodes associated with the optoelectronic component in electrical contact with the metal cluster.

4. The device of claim 1 wherein the body includes a limit stop for defining the region for receiving the optoelectronic component.

5. The device of claim 1 wherein the optoelectronic component is a PLCC4-type light-emitting diode.

* * * * *